(12) United States Patent
Kuroda et al.

(10) Patent No.: US 7,656,039 B2
(45) Date of Patent: Feb. 2, 2010

(54) MULTI CHIP MODULE

(75) Inventors: Hiroshi Kuroda, Tokyo (JP); Kazuhiko Hiranuma, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 305 days.

(21) Appl. No.: 11/563,416

(22) Filed: Nov. 27, 2006

(65) Prior Publication Data

US 2007/0120267 A1 May 31, 2007

(30) Foreign Application Priority Data

Nov. 28, 2005 (JP) .............................. 2005-341558

(51) Int. Cl.
*H01L 23/42* (2006.01)
*H01L 23/34* (2006.01)

(52) U.S. Cl. .................. 257/777; 257/784; 257/723

(58) Field of Classification Search ................ 257/777, 257/784, E23.169
See application file for complete search history.

(56) References Cited

U.S. PATENT DOCUMENTS 5,323,060 A * 6/1994 Fogal et al. ................. 257/777
6,392,304 B1 * 5/2002 Butler ........................ 257/777
6,392,950 B2 5/2002 Ayukawa et al.
6,943,294 B2 * 9/2005 Kang et al. ................. 174/541
6,979,905 B2 * 12/2005 Nishida et al. .............. 257/777
7,253,511 B2 * 8/2007 Karnezos et al. ............ 257/686
2002/0140107 A1 * 10/2002 Kato et al. .................. 257/777
2003/0047813 A1 * 3/2003 Goller et al. ................ 257/777
2003/0137042 A1 * 7/2003 Mess et al. .................. 257/686
2003/0205826 A1 * 11/2003 Lin et al. .................... 257/777

FOREIGN PATENT DOCUMENTS

JP 2001-344967 12/2001

* cited by examiner

*Primary Examiner*—Nitin Parekh
(74) *Attorney, Agent, or Firm*—Mattingly & Malur, P.C.

(57) ABSTRACT

The present invention provides a multi chip module which realizes high functions or high performances thereof. A multi chip module is constituted by stacking a first semiconductor chip on which a digital signal processing circuit is mounted, a second semiconductor chip which constitutes a dynamic random access memory, a third semiconductor chip which constitutes a non-volatile memory, and a mounting substrate thus forming the stacked structure. The first semiconductor chip is arranged on an uppermost layer with a spacer interposed on a back surface side thereof. The second semiconductor chip is arranged on the mounting substrate.

4 Claims, 5 Drawing Sheets

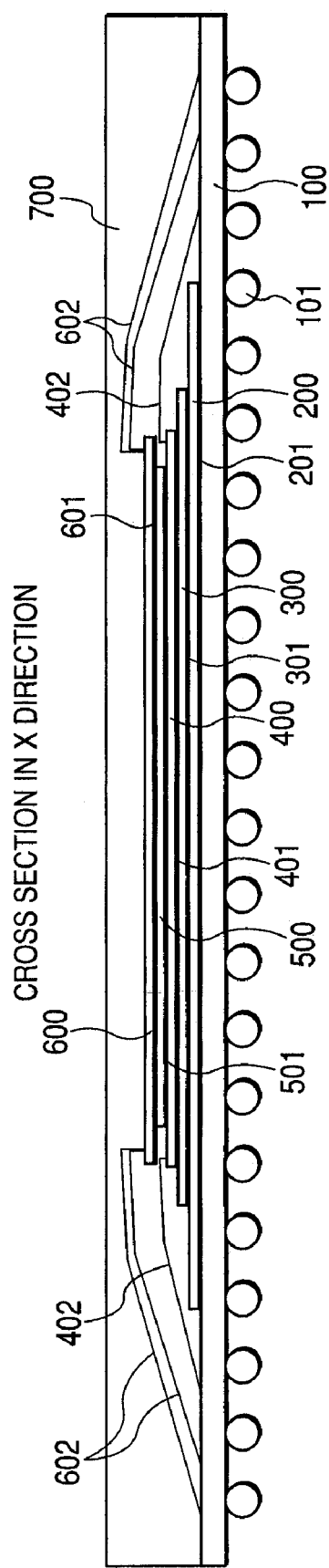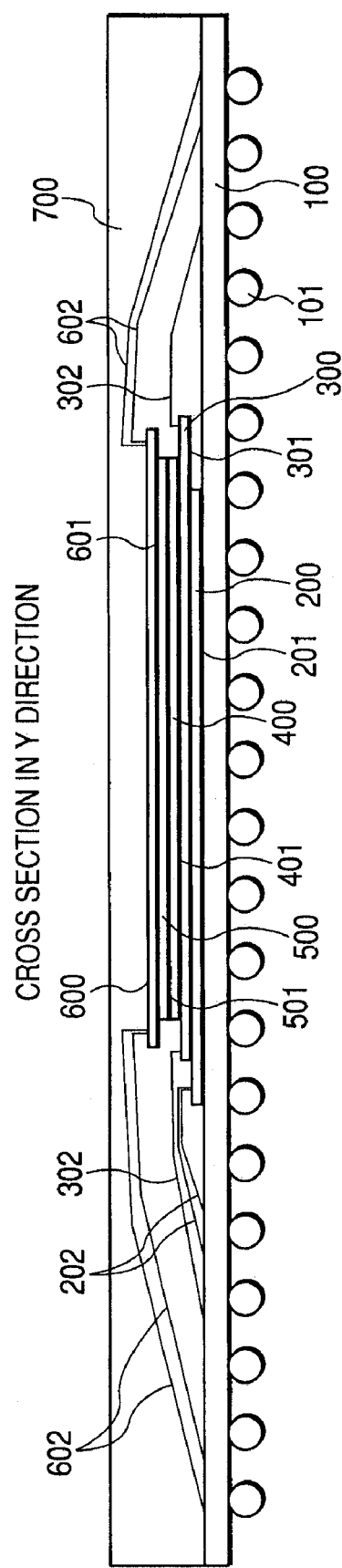

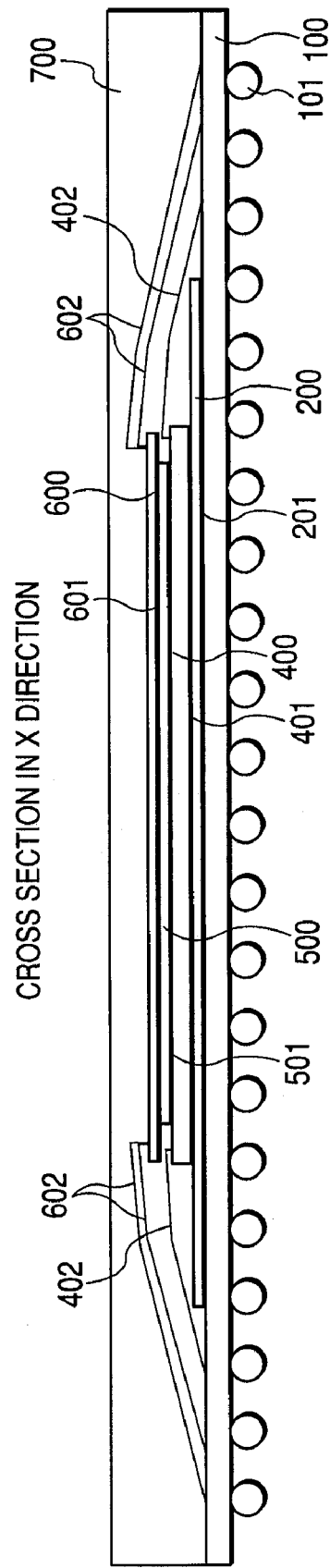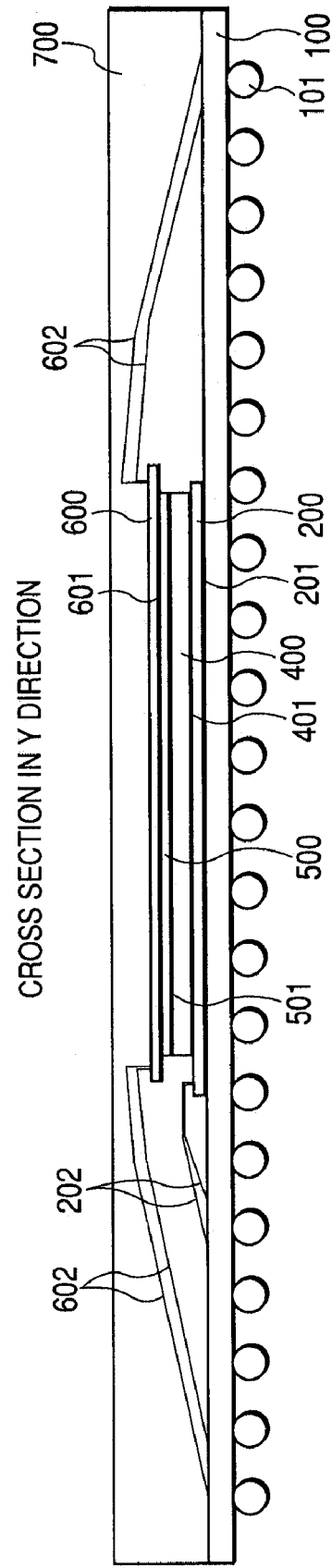

NOR-TYPE

NAND-TYPE

NOR-TYPE

NAND-TYPE

MULTI CHIP MODULE

CROSS-REFERENCE TO RELATED APPLICATION

The present application claims priority from Japanese patent application No. 2005-341558 filed on Nov. 28, 2005, the content of which is hereby incorporated by reference into this application.

BACKGROUND OF THE INVENTION

The present invention relates to a multi chip module (MCM), and more particularly to a technique which is effectively applicable to a multi chip module which is integrally formed substantially as one semiconductor integrated circuit device by mounting a microcomputer chip, a DRAM chip and a non-volatile memory chip on one mounting substrate.

In a so-called multi chip module technique, a semiconductor integrated circuit device is constituted by mounting a plurality of semiconductor chips on a mounting substrate having a plurality of inner lines and a plurality of external terminals and the plurality of semiconductor chips and the mounting substrate are integrally formed. Japanese Unexamined Patent Publication No. 2001-344967 (patent document 1) proposes a technique which realizes a memory device which exhibits a large storage capacity and a small data holding current by adopting the stacked structure which stacks a non-volatile memory, a SRAM, a DRAM and a control circuit which controls these memories.

SUMMARY OF THE INVENTION

In a multi chip module (MCM) technique, a plurality of semiconductor chips which is remarkably miniaturized and is referred to as so-called bear chips is formed into a semiconductor device in a form of one package. Since a wiring distance between respective chips which are connected with each other can be shortened, it is possible to enhance the properties of the semiconductor device. By forming the plurality of chips into one package, a mounting surface can be reduced whereby an electronic device can be minimized. The above-mentioned patent document 1 is directed to the memory device and no consideration is made with respect to the enhancement of functions of the whole system which features the MCM and the further miniaturization of the memory device.

For example, it is possible to sufficiently make use of features of the above-mentioned MCM in selecting the parts which are closely relevant to the data processing on the microcomputer chip such as the microcomputer chip, the dynamic RAM (DRAM) and a flash memory chip. Due to such a combination, it is possible to realize a so-called SiP (System in Package). Such a SiP is suitable for a digital still camera, a mobile phone or the like.

Inventors of the present invention have found that when the above-mentioned respective chips are assembled into the stacked structure on the mounting substrate for the miniaturization of the above-mentioned SiP, due to the difference among functions and operational margins that the respective chips possess, the close joining of the chips gives rise to another new drawback. That is, the DRAM possesses an extremely small operational margin to ensure the high-speed reading of a fine storage charge whereby the DRAM is liable to be easily influenced by external noises. On the other hand, the microcomputer chip performs signal processing of digital signals and hence, the microcomputer generates large power source noises thus leading to the fluctuation of a substrate bias voltage. Accordingly, when the microcomputer chip is mounted on a surface of the DRAM chip, the noises which are generated by the microcomputer chip are transmitted to the DRAM side via a substrate-parasitic capacitance thus worsening the operational margin of the DRAM.

It is an object of the present invention to provide a multi chip module which can realize the high function or the high performance. The above-mentioned and other objects of the present invention and novel features of the present invention will become apparent from the description of this specification and attached drawings.

To briefly explain the summary of typical inventions among the inventions disclosed in this specification, they are as follows. That is, a multi chip module is constituted by stacking a first semiconductor chip on which a digital signal processing circuit is mounted, a second semiconductor chip which constitutes a dynamic random access memory, a third semiconductor chip which constitutes a non-volatile memory, and a mounting substrate thus forming the stacked structure. The first semiconductor chip is arranged on an uppermost layer with a spacer interposed on a back surface side thereof. The second semiconductor chip is arranged on the mounting substrate.

Due to the presence of the spacer, the propagation of noises which are generated in the first semiconductor chip to lower layers can be prevented. Since the second chip is mounted on the mounting substrate, the propagation noises can be reduced.

BRIEF DESCRIPTION OF THE DRAWINGS

FIG. 1 is a schematic cross-sectional view showing one embodiment of an MCM (SiP) according to the present invention;

FIG. 3 is a schematic cross-sectional view showing another embodiment of the MCM (SiP) according to the present invention;

DESCRIPTION OF THE PREFERRED EMBODIMENTS

Figure 2:
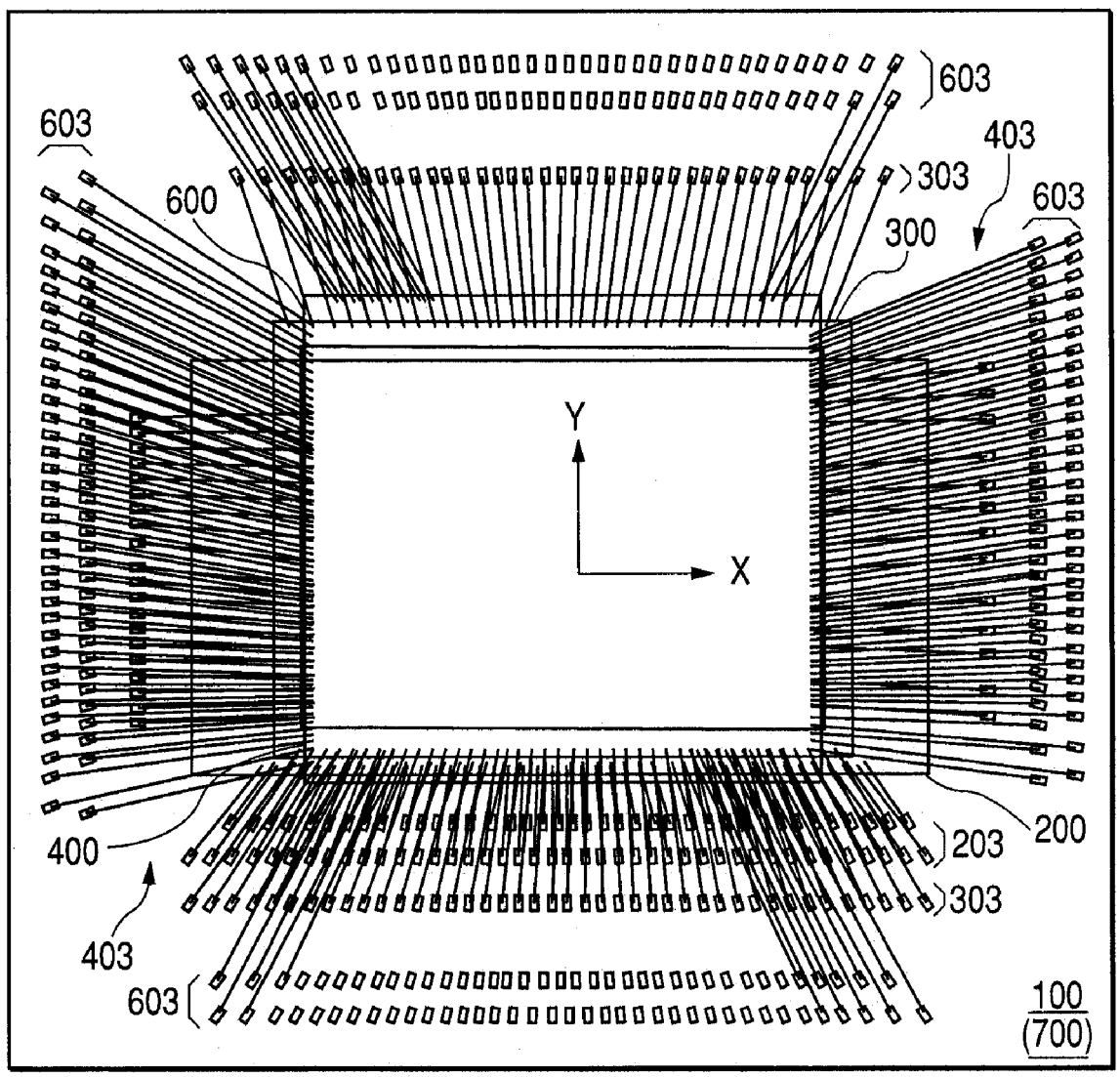
FIG. 2 is a plan view showing one embodiment of the MCM shown in FIG. 1.

FIG. 1 is a schematic cross-sectional view showing one embodiment of an MCM (SiP) according to the present invention, and FIG. 2 is a plan view showing one embodiment of the MCM shown in FIG. 1. FIG. 1A is a cross-sectional view in the X direction of FIG. 2, and FIG. 1B is a cross-sectional view in the Y direction in FIG. 2. In FIG. 1 and FIG. 2, with respect to the MCM in this embodiment, although not particularly limited, a particular-application-use integrated circuit (hereinafter, referred to as an ASIC) 600 which has a one-chip microcomputer function including a CPU (Central Processing Unit), batch erasure-type non-volatile memories (hereinafter, referred to as FLASHs) 300, 400 which are constituted of two types of FLASHs of NOR-type and NAND-type and a Double Data Rate-Synchronous DRAM (Double Data Rate-Synchronous Dynamic Random Access Memory; hereinafter, referred to as a DDR-SDRAM) 200 are stacked on a mounting substrate thus forming the stacked structure.

In the above-mentioned NOR-type FLASH 300, bonding pads are arranged along peripheries of the chip at both sides of the NOR-type FLASH in the X direction in FIG. 2. On the other hand, in the NAND-type FLASH 400 which is arranged over the NOR-type FLASH 300, bonding pads are arranged along peripheries of the chip at both sides in the Y direction of the NAND-type FLASH in FIG. 2 which are rotated by 90° with respect to the above-mentioned NOR-type FLASH 300. Electrodes 303 corresponding to the NOR-type FLASH 300 which are arranged on the mounting substrate 100 are arranged in a dispersed manner in the Y direction, while electrodes 403 corresponding to the NAND-type FLASH 400 which are arranged on the mounting substrate 100 are arranged in a dispersed manner in the X direction. It is possible to disperse the electrodes 303 and 403 along four sides of the mounting substrate 100. Due to such a constitution, it is possible to disperse bonding wires 302, 402 which connect the bonding pads of the NOR-type and NAND-type FLASHs 300, 400 and the electrodes formed over the mounting substrate 100.

In the above-mentioned DDR-SDRAM 200, although not particularly limited, bonding pads are arranged along one-end-side chip periphery in the Y direction in the drawing, electrodes are arranged on the mounting substrate 100 corresponding to the bonding pads, and the bonding pads and the electrodes are connected with each other by bonding wires 202. A large number of bonding pads are arranged on the ASIC 600 which constitutes an uppermost layer along four sides of the ASIC 600, while electrodes 603 are arranged on the mounting substrate 100 corresponding to the large number of bonding pads in a state that the electrodes 603 are arranged in two rows on an outermost peripheral side. In the drawing, bonding wires 602 which establish the connection with the above-mentioned ASIC 600 have a portion thereof illustrated in a representative manner. In this manner, the electrode 603 which are formed over the mounting substrate 100 are arranged in a dispersed manner surrounding a chip mounting portion while preventing the sides of four semiconductor chips in total on which the bonding pads are mounted from being overlapped to each other as much as possible. As a result, it is possible to reduce a size of the mounting substrate 100 as well as to preliminarily prevent short-circuiting between the bonding wires.

The DDR-SDRAM 200 is adhered using a thermosetting adhesive agent or a die bonding film 201 which is formed over a back surface thereof. In the same manner, the NOR-type FLASH 300, the NAND-type FLASH 400, a spacer 500 and the ASIC 600 are respectively adhered using a thermosetting adhesive agent or die bonding films 301, 401, 501, 601 which are formed over back surfaces thereof. Although not particularly limited, the above-mentioned spacers 500 are formed of a silicon board for making a thermal expansion coefficient thereof substantially equal to a thermal expansion coefficient of the semiconductor chip having the stacked structure. In FIG. 2, the above-mentioned spacer 500 is omitted and the bonding wires 602 which perform the connection with ASIC 600 are omitted from the drawing while depicting only the representative bonding wires 602.

The above-mentioned spacer 500 is configured to possess following two functions. First of all, the spacer 500 plays a role of a shield which prevents the transmission of a substrate potential of the ASIC 600 by which large power source noises are transmitted as described above to the semiconductor chip arranged below the ASIC 600 via a parasitic capacitance. Further, the spacer 500 also plays a role of ensuring a space for arranging the bonding wires 402 of the NAND-type FLASH 400 arranged below the spacer 500. Here, the die bonding film 601 which is formed over the back surface side of the above-mentioned ASIC 600 is also used for maintaining the electric insulating property even when the bonding wires 402 formed over the NAND-type FLASH 400 arranged below the spacer 500 are brought into contact with a back surface of the ASIC 600 arranged above the spacer 500. Even when the ASIC 600 is adhered to the spacer 500 using the above-mentioned thermosetting adhesive agent, it is preferable to impart the above-mentioned electric insulating property by applying the thermosetting adhesive agent to the whole back surface of the ASIC 600.

The bonding wires which are respectively formed over the above-mentioned DDR-SDRAM 200, NOR-type FLASH 300, NAND-type FLASH 400, spacer 500 and ASIC 600 maybe sealed by a resin sealing body 700, and ball-shaped reflows 101 which constitutes external terminals are mounted on a back surface side of the mounting substrate 100 thus forming an MCM.

The above-mentioned mounting substrate 100 includes a insulating substrate which is made of glass epoxy or glass, relatively fine internal lines having the multi-layered wiring constitution which are formed over the insulating substrate, and a plurality of external terminals. On a semiconductor-chip-mounting-side main surface of the mounting substrate 100, the electrodes 203, 303, 403 and 603 which are connected with the bonding pads respectively formed over the above-mentioned semiconductor chips DDR-SDRAM 200, NOR-type FLASH 300, NAND-type FLASH 400 and ASIC 600 by wire connection are formed. These electrodes are connected with the ASIC, the DDR-SDRAM 200, the NOR-type FLASH 300 and the NAND-type FLASH 400 by the above-mentioned internal lines.

Although not particularly limited, to facilitate a memory test, that is, to allow a memory access to the DDR-SDRAM 200, the NOR-type FLASH 300 and the NAND-type FLASH 400 individually, no lines are provided for connecting ASIC-side selection signal terminals and memory-side selection signal terminals. These lines are connected by mounting the MCM on the mounting substrate thus enabling the microcomputer provided to the ASIC 600 to get access to the DDR-SDRAM 200, the NOR-type FLASH 300 and the NAND-type FLASH 400.

To summarize assembling steps of the MCM of this embodiment, they are as follows.

(1) A die bonding film is adhered to a semiconductor wafer on which respective semiconductor chips are formed and, thereafter, dicing is performed.
(2) The DDR-SDRAM is mounted on the mounting substrate by die bonding.
(3) The NOR-type FLASH is mounted on the above-mentioned DDR-SDRAM by die bonding.
(4) The NAND-type FLASH is mounted on the above-mentioned NOR-type FLASH by die bonding.
(5) The spacer is mounted on the above-mentioned NAND-type FLASH by die bonding.
(6) Plasma treatment is performed to enhance the wire bonding property.
(7) The wire bonding is applied to the DDR-SDRAM.
(8) The wire bonding is applied to the NOR-type FLASH.
(9) The wire bonding is applied to the NAND-type FLASH.
(10) The ASIC is mounted on the spacer by die bonding.
(11) The wire bonding is applied to the ASIC.
(12) Plasma treatment is performed to enhance the adhesiveness of a mold resin.

(13) Molding (sealing) is performed.
(14) Laser marking is performed.
(15) Ball adhesion (ballmounting, reflow, cleaning) is performed.
(16) Semiconductor wafer is cut into pieces (multiple chip substrate).
(17) Packaging.
(18) Pay out.

The above-mentioned NOR-type FLASH is used as a code data storing memory for application software, program or the like. The above-mentioned NAND-type FLASH 400 is used as a data storage memory in place of hard disc or the like. The above-mentioned NOR-type FLASH is used for writing the program once initially and hence, the noise level is small. Information is written in the NAND-type FLASH 400 when necessary and hence, the noise level is intermediate. The DDR-SDRAM 200 handles fine signal charges and exhibits extremely low noise resistance attributed to a high-speed operation and hence, the DDR-SDRAM 200 is liable to be easily influenced by noises which other chip generates. Here, microcomputer is always operated with digital signals of full amplitudes and also performs a data outputting operation and hence, the microcomputer exhibits the largest noise level.

In the above-mentioned embodiment, by focusing on the difference of respective chips in function and operational margin, the DDR-SDRAM 200 which exhibits the lowest noise resistance is mounted on a first row (lowermost row) thus reinforcing the DDR-SDRAM 200 by lowering the impedance of the power source supply path and, at the same time, the chips are stacked in descending order of noise level thus decreasing the propagation of noises from above. To the ASIC (microcomputer) 600 which is regarded as a noise generating source, the spacer 500 is interposed and is used as a shielding member to prevent the propagation of noises to the lower side. Since the ASIC (microcomputer) 600 includes a large number of pins, it is desirable to perform the wire bonding connection by mounting the ASIC 600 on the uppermost row. Due to such a connection by such wire bonding, it is possible to realize the reduction of cost (substrate cost, process cost). That is, in mounting the ASIC 600 on the surface of the mounting substrate using an area array pad technique, the substrate cost and the process cost are pushed up. By respectively interposing the NOR-type FLASH 300, the NAND-type FLASH 400 and the spacer 500 which generate noises at small noise levels with respect to the DDR-SDRAM 200 which exhibits low noise resistance as described above, the DDR-SDRAM 200 which is arranged spaced apart from the ASIC 600 which is the noise generating source can be operated at a high-speed and in a stable manner thus providing high functions or high performances to the MCM as a whole.

Figure 4:
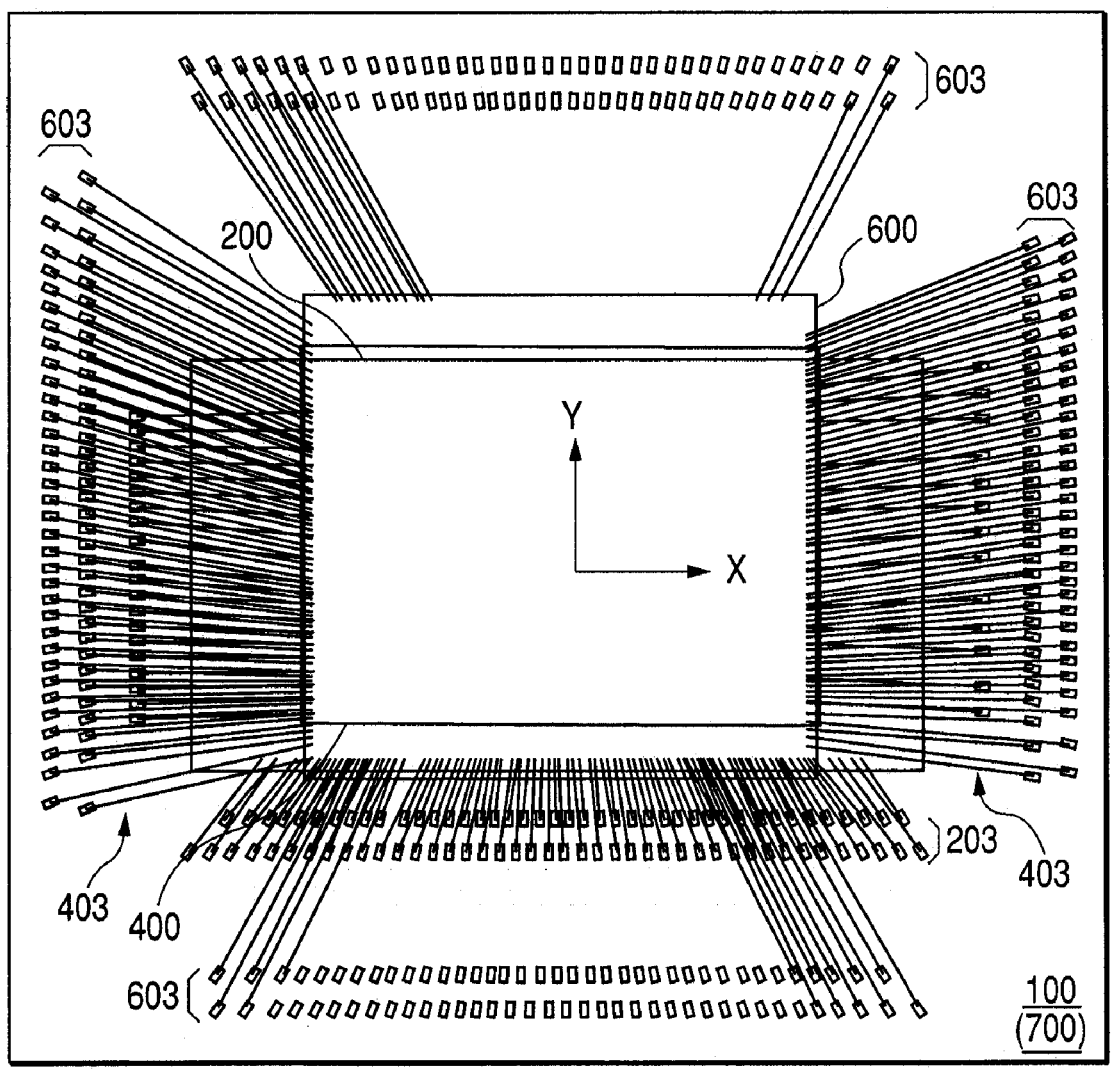
FIG. 4 is a plan view showing one embodiment of the MCM shown in FIG. 3.

FIG. 3 is a schematic cross-sectional view of another embodiment of the SiP according to the present invention, while FIG. 4 is a plan view of a chip. The MCM of this embodiment is constituted of the combination of three semiconductor chips consisting of the ASIC 600, the NAND-type FLASH 400 and the DDR-SDRAM 200. This embodiment corresponds to a mode in which the NOR-type FLASH 300 which constitutes the second layer from below in the embodiment shown in FIG. 1 and FIG. 2 is deleted. In the same manner as the embodiment shown in FIG. 1 and FIG. 2, the spacer 500 is omitted in FIG. 4.

To summarize assembling steps of the MCM of this embodiment, they are as follows.

(1) A die bonding film is adhered to a semiconductor wafer on which respective semiconductor chips are formed and, thereafter, dicing is performed.
(2) The DDR-SDRAM is mounted on the mounting substrate by die bonding.
(3) The NAND-type FLASH is mounted on the above-mentioned NOR-type FLASH by die bonding.
(4) The spacer is mounted on the above-mentioned NAND-type FLASH by die bonding.
(5) Plasma treatment is performed to enhance the wire bonding property.
(6) The wire bonding is applied to the DDR-SDRAM.
(7) The wire bonding is applied to the NAND-type FLASH.
(8) The ASIC is mounted on the spacer by die bonding.
(9) The wire bonding is applied to the ASIC.
(10) Plasma treatment is performed to enhance the adhesiveness of a mold resin.
(11) Molding (sealing) is performed.
(12) Laser marking is performed.
(13) Balladhesion (ballmounting, reflow, cleaning) is performed.
(14) Semiconductor wafer is cut into pieces (multiple chip substrate).
(15) Packaging.
(16) Pay out.

Since the NOR-type FLASH is costly, there exists a large demand for a system which has no NOR-type FLASH. This embodiment is directed to the SiP having the constitution which eliminates the NOR-type FLASH. Also in this embodiment, the DDR-SDRAM 200 which exhibits the lowest noise resistance is mounted on a first row (the lowermost row) so as to reinforce the DDR-SDRAM 200 by lowering the impedance of the power source supply path and, at the same time, the NAND-type FLASH 400 which exhibits the relatively small noise level is mounted on the DDR-SDRAM 200. To the ASIC 600 which is regarded as a noise generating source, the spacer 500 is interposed and is used as a shielding member to prevent the propagation of noises to the lower side. Since the ASIC 600 includes a large number of pins, it is desirable to perform the wire bonding connection by mounting the ASIC 600 on the uppermost row. Due to such connection by wire bonding, it is possible to realize the reduction of cost (substrate cost, processing cost) in the same manner as the above.

Figure 5A:
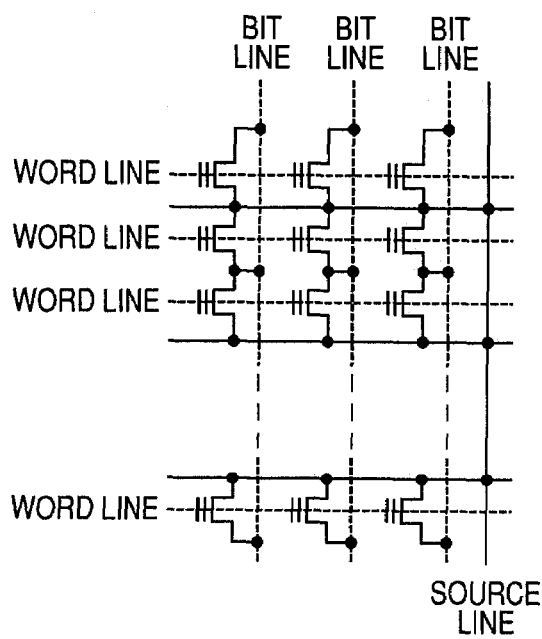
FIG. 5A and FIG. 5B are circuit diagrams showing one embodiments of memory cell array parts of NOR-type and NAND-type FLASHs used in the present invention.
Figure 5B:
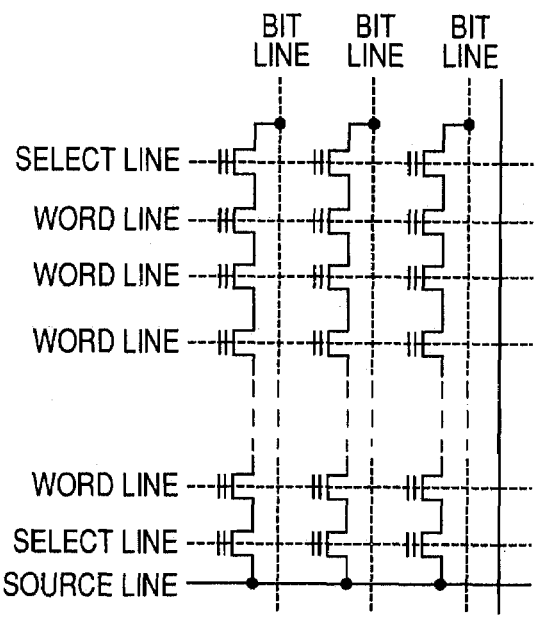

FIG. 5A and FIG. 5B are circuit diagrams showing one embodiments of memory cell array parts of NOR-type and NAND-type FLASHs used in the present invention. The NOR-type FLASH shown in FIG. 5A forms a non-volatile memory cell having a stacked gate structure at an intersecting point of a word line and a bit line. A control gate of the memory cell is connected to the word line. A drain of the memory cell is connected to the bit line, while a source of the memory cell is connected to a source line. With respect to the NOR-type FLASH, even when an access is made to any portion of a memory region, the portion is read at a high-speed (random access).

In the NAND-type FLASH shown in FIG. 5B, memory cells are arranged in series by sandwiching a MOSFET which constitutes a selection gate which is selected by a select line between a bit line and a source line. Control gates of the memory cells are respectively connected to each word line. In the NAND-type FLASH of this embodiment, due to the serial connection structure, when the NAND-type FLASH is accessed in a random manner as in the case of the NOR-type FLASH, a reading speed is delayed and hence, the NAND-type FLASH is used in a serial access.

Figure 6A:
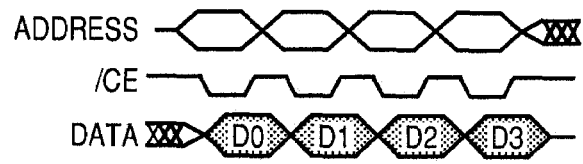
FIG. 6A and FIG. 6B are waveform charts of reading operations of the memory cell array parts of the NOR-type and NAND-type FLASHs shown in FIG. 5A and FIG. 5B.
Figure 6B:
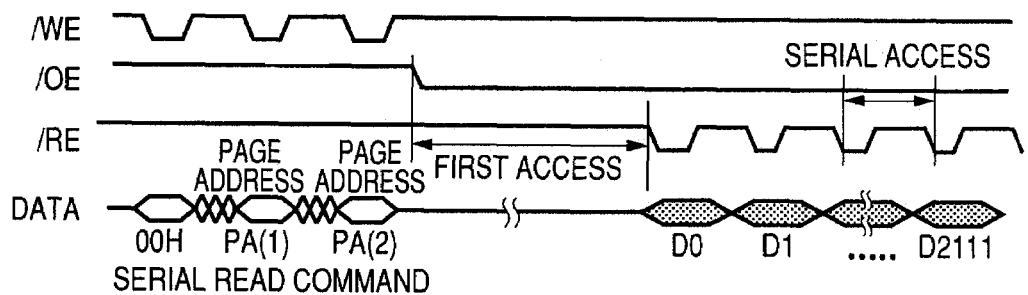

FIG. 6A and FIG. 6B are waveform charts of reading operations of the memory cell array parts of the NOR-type and NAND-type FLASHs shown in FIG. 5A and FIG. 5B. As in the case of the NOR-type FLASH shown in FIG. 6A, a random access is performed to read data in response to an address signal and an output enable signal/OE. On the other hand, in the NAND-type FLASH shown in FIG. 6B, a serial read command 00H, a page address lower PA(1), and a page address upper PA(2) are inputted initially and, thereafter, a first access of the inner memory selection is performed and, after a lapse of μseconds, the serial access data D0 to D2111 are outputted in synchronism with a clock/RE. The larger a quantity of this continuous data, an access time per data is shortened and hence, the NAND-type FLASH is suitable for inputting and outputting of a large-quantity data.

The above-mentioned NAND-type FLASH has no independent address terminals. As described above, by making use of data terminals, data is inputted as page address lower PA(1) and upper PA(2) after the serial read command 00H. Accordingly, the number of terminals can be reduced corresponding to the number of undesired address terminals. Accordingly, different from the embodiment in which terminals are distributed to both sides of the chip as shown in FIG. 1 to FIG. 4, the terminals are provided along one side. To the contrary, in the DDR-SDRAM, different from the embodiment shown in FIG. 1 to FIG. 4 in which the bonding pads are formed over one side of the chip in a concentrated manner as shown in FIG. 1 to FIG. 4, the bonding pads may be distributed on both sides of the DDR-SDRAM chip. That is, in the constitution in which the bonding pads of the NAND-type FLASH 400 are arranged along one side and the bonding pads of the DDR-SDRAM 200 are distributed to the periphery of the chip on both sides, in plan views shown in FIG. 2 and FIG. 4, the constitution which exchanges the DDR-SDRAM 200 and the NAND-type FLASH 400 with respect to the bonding pads and the bonding wires may be adopted.

Although the invention which is made by inventors of the present invention has been specifically explained in conjunction with the embodiments, the present invention is not limited to the above-mentioned embodiments and various modifications are conceivable without departing from the gist of the present invention. For example, the NOR-type FLASH may be replaced with a non-volatile memory which can be written only one time. Further, the memory capacity of the DDR-SDRAM may be increased by overlapping the two DDR-SDRAMs. The above-mentioned DDR-SDRAM may be an SDRAM or a DRAM. The present invention is popularly used in the semiconductor device having a multi chip module constitution.

What is claimed is:

1. A multi chip module comprising:
   a mounting substrate having an upper surface, an electrode formed on the upper surface, and a lower surface opposite to the upper surface;
   a first semiconductor chip having a first main surface, a first bonding pad formed on the first main surface, and a first back surface opposite to the first main surface, and mounted over the upper surface of the mounting substrate;
   a second semiconductor chip having a second main surface, a second bonding pad formed on the second main surface, and a second back surface opposite to the second main surface, and mounted over the first semiconductor chip; a silicon substrate mounted over the second semiconductor chip;
   a third semiconductor chip having a third main surface, a third bonding pad formed on the third main surface, and a third back surface opposite to the third main surface, and mounted over the silicon substrate; and
   a sealing body sealing the first semiconductor chip, the second semiconductor chip and the third semiconductor chip;
   wherein the first semiconductor chip is a dynamic random access memory;
   wherein the second semiconductor chip is a non-volatile memory;
   wherein the third semiconductor chip has a digital signal processing circuit controlling the first semiconductor chip;
   wherein the third semiconductor chip generates a noise;
   wherein the first semiconductor chip is more susceptible to the noise than the second semiconductor chip; and
   wherein a size of the third semiconductor chip is smaller in an area than that of the first semiconductor chip.

2. The multi chip module according to the claim 1, wherein a size of the third semiconductor chip is smaller in an area than that of the second semiconductor chip.

3. The multi chip module according to the claim 1, wherein the first semiconductor chip is mounted over the upper surface of the mounting substrate such that the first back surface of the first semiconductor chip faces toward the upper surface of the mounting substrate;
   wherein the second semiconductor chip is mounted above the first main surface of the first semiconductor chip such that the second back surface of the second semiconductor chip faces toward the first main surface of the first semiconductor chip, and such that the first bonding pad of the first semiconductor chip is exposed from the second semiconductor chip;
   wherein the third semiconductor chip is mounted above the second semiconductor chip such that the third back surface of the third semiconductor chip faces toward the second main surface of the second semiconductor chip, and such that the second bonding pad of the second semiconductor chip is exposed from the third semiconductor chip;
   wherein the first bonding pad is electrically connected with the electrode via a first bonding wire;
   wherein the second bonding pad is electrically connected with the electrode via a second bonding wire;
   wherein the third bonding pad is electrically connected with the electrode via a third bonding wire;
   wherein a length of the second bonding wire is longer than that of the first bonding wire; and
   wherein a length of the third bonding wire is longer than that of the first bonding wire.

4. The multi chip module according to the claim 1, wherein a ball is formed on the lower surface of the mounting substrate.

* * * * *